(12) United States Patent
Chang et al.

(10) Patent No.: US 10,606,323 B1
(45) Date of Patent: Mar. 31, 2020

(54) INFORMATION HANDLING SYSTEM TOUCHPAD WITH INTEGRATED WIRELESS ANTENNA

(71) Applicant: Dell Products L.P., Round Rock, TX (US)

(72) Inventors: Ching Wei Chang, Cedar Park, TX (US); Allen B. McKittrick, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/220,666

(22) Filed: Dec. 14, 2018

(51) Int. Cl.
| | |
|---|---|
| *G06F 1/16* | (2006.01) |
| *H05K 5/00* | (2006.01) |
| *H05K 7/00* | (2006.01) |
| *G06F 3/044* | (2006.01) |
| *G06F 3/0354* | (2013.01) |
| *H05K 5/02* | (2006.01) |
| *H03K 17/98* | (2006.01) |
| *H05K 5/03* | (2006.01) |
| *H03K 17/96* | (2006.01) |

(52) U.S. Cl.
CPC ............ *G06F 1/169* (2013.01); *G06F 1/1698* (2013.01); *G06F 3/03547* (2013.01); *G06F 3/044* (2013.01); *H03K 17/962* (2013.01); *H03K 17/98* (2013.01); *H05K 5/0226* (2013.01); *H05K 5/0239* (2013.01); *H05K 5/03* (2013.01)

(58) Field of Classification Search
CPC ...... G06F 1/169; G06F 1/1698; G06F 1/1684; G06F 1/1643; G06F 1/1662; G06F 3/03547; G06F 3/044; H05K 5/0226; H05K 5/0239; H05K 5/03
USPC ............. 361/679.55, 679.56, 679.02, 679.01
See application file for complete search history.

(56) References Cited

U.S. PATENT DOCUMENTS 6,380,930 B1 * 4/2002 Van Ruymbeke .... G06F 1/1616
178/18.01
6,765,536 B2 7/2004 Phillips et al.
(Continued)

OTHER PUBLICATIONS

Semtech, "Semtech SX9306 Ultra Low Power SAR Proximity Sensor," downloaded from https://www.mouser.com/new/semtech/semtech-sx9306-sar-sensor/ on Dec. 13, 2018, 2 pages.
(Continued)

*Primary Examiner* — Anthony M Haughton
(74) *Attorney, Agent, or Firm* — Zagorin Cave LLP; Robert W. Holland

(57) ABSTRACT

A portable information handling system processes information with processing components disposed in a main housing portion and presents the information at a display disposed in a lid housing portion. A keyboard and touchpad disposed at the upper surface of the main housing portion accept end user inputs. The touchpad translates touch inputs at a touch detection surface into cursor movement at the display and accepts presses at a touch button as input clicks. One or more antenna integrated in the touchpad to support communication of wireless signals by a transceiver disposed in the main housing, such as to support wireless local area network communications. A ground plane of the touchpad forms openings under the one or more antenna to provide a pathway for the wireless signals.

19 Claims, 4 Drawing Sheets

(56) References Cited

U.S. PATENT DOCUMENTS

| | | | | |
|---|---|---|---|---|
| 2002/0054162 A1* | 5/2002 | Fujihara | ................ | G06F 1/1616 |
| | | | | 715/846 |
| 2008/0062065 A1 | 3/2008 | Yamamoto et al. | | |
| 2010/0112833 A1 | 5/2010 | Jeon | | |
| 2013/0271942 A1* | 10/2013 | Kim | .................... | H05K 1/0218 |
| | | | | 361/816 |
| 2013/0341409 A1* | 12/2013 | Wu | .................. | G06K 19/07773 |
| | | | | 235/492 |
| 2018/0032166 A1* | 2/2018 | Orihara | ................... | G06F 3/041 |

OTHER PUBLICATIONS

Toit, R., "Using proximity sensing to meet mobile device FCC SAR regulations," Apr. 17, 2012, downloaded from https://www.embedded.com/design/connectivity/4371201/1/Using-proximity-sensing-to-meet-mobile-device-FCC-SAR-regulations, 4 pages.

\* cited by examiner

INFORMATION HANDLING SYSTEM TOUCHPAD WITH INTEGRATED WIRELESS ANTENNA

BACKGROUND OF THE INVENTION

Field of the Invention

The present invention relates in general to the field of information handling system wireless communication, and more particularly to an information handling system touchpad with integrated wireless antenna.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems generally include processing components, a power source and input/output (I/O) devices in a portable housing to operate free from external resources, such as power cables and peripheral displays. Typical convertible information handling systems have main and lid housing portions rotationally coupled by a hinge. The main housing portion typically integrates a processor and memory to execute instructions that process information. The lid housing portion typically integrates a display interfaced with the processor to present the information as visual images. The lid housing portion rotates from a closed position having the display proximate the main housing portion to an open position that exposes the display for end user viewing. The closed position provides portability and protection of the system when not in use. The open position rotates the display to a vertical viewing position over the main housing portion and exposes an upper surface of the main housing portion. Generally, the upper surface of the main housing portion integrates a keyboard that accepts typed inputs by an end user. In addition, the main housing portion often integrates a touchpad device near the keyboard that accepts end user touches similar to a peripheral mouse or other pointing device. Some touchpad devices press down at a front side to accept end user clicks similar to mouse clicks, while some touchpad devices include click buttons that move independently of the touchpad. An end user moves a finger across the touchpad to move a cursor, usually an arrow, across the display and presses down on the touchpad or buttons to "click" inputs similar to mouse button inputs.

To improve portability, information handling system manufacturers generally attempt to efficiently use the portable housing footprint. Generally, housing dimensions are driven by the size of a display integrated in the lid housing portion. Once a display size is selected, efficient use of housing space tends to call for a minimal border or bezel around the display perimeter. Further size and weight reductions are typically accomplished by minimizing the height of the system, which reduces space to accommodate processing components in the main housing portion and increases difficulty in managing thermal conditions, such as with an internal cooling fan. Generally, information handling system capabilities are impacted as system height decreases with less powerful processing components having less restrictive thermal constraints. However, reduced housing thickness and weight tend to improve portability by making end user interactions less awkward. Some convertible information handling systems include hinges that support 360 degrees of housing rotation so that the end user can rotate the main housing portion completely under the lid housing portion and interact with the display as a tablet. The design of such convertible systems calls for a minimal weight yet a robust housing structure that can withstand repeated rotation about the hinge, which makes light weight metal material for the housing desirable.

Portable information handling systems typically include wireless networking capabilities to support portable operations, such as wireless local area network (WLAN), wireless wide area network (WWAN) and wireless personal area network (WPAN) wireless network interface cards (WNICs). Wireless communications allow an end user to interface with the Internet and with wireless peripherals so that portable operations can be performed without cables. One difficulty with supporting wireless communications at a convertible information handling system is that the WNIC communicates through one or more antenna whose radiation efficiency generally relates to the position within the portable housing. For instance, an antenna generally requires an antenna keepout, clearance, or RF transparent material all around the antenna radiating element, while a metal housing will reflect and block radio signals. In typical portable use cases, the external radio may be located at varying relative orientations so that the antenna should have an unimpeded radiation pattern as much as possible in all directions. However, minimalist housing considerations tend to restrict antenna placement, such as by relying on a metal housing and tightly packing in processing components. For instance, conventional antenna placement is in the lid housing portion at the perimeter of the display; however, a borderless display integrated in a metal housing leaves little space to accommodate an antenna.

SUMMARY OF THE INVENTION

Therefore, a need has arisen for a system and method which integrates an antenna in an information handling system low-height portable housing.

In accordance with the present invention, a system and method are provided which substantially reduce the disadvantages and problems associated with previous methods and systems for integrating an antenna in a portable information handling system housing. One or more antenna integrate in an information handling system touchpad printed circuit board to transmit wireless signals, such as in support of a wireless local area network (WLAN).

More specifically, a portable information handling system integrate a keyboard and touchpad in an upper surface of a main housing portion that contains processing components to process information, such as a central processing unit (CPU) and memory. The touchpad accepts touch inputs at a touch detection surface to control an icon presented at a display in a lid housing portion, such as similar to the manner in which mouse inputs move a cursor arrow at a display. Button press inputs, similar to mouse clicks, are accepted at the front of the touchpad, such as by vertically moving the front edge as a click pad or interfacing separate left and right press buttons that translate a push input to the touchpad. An antenna is formed proximate each button press area to communicate wireless signals through a radiofrequency transparent region at press buttons of the touchpad, such as one or more plastic buttons disposed over the antenna to accept click inputs. To enhance isotropic wireless signal transmission, a ground plane formed below the antenna has a mesh, grid or other from that passes radiofrequency energy wavelengths associated with the antenna.

The present invention provides a number of important technical advantages. One example of an important technical advantage is that an antenna integrated in a portable information handling system touchpad has an improved radiation pattern for a low height housing with minimal disruption of housing design and component placement. Antenna placement in or near touchpad click buttons provides a radiation pathway through non-metallic button covers with an isotropic pattern that adapts to mobile usage models. A mesh or patterned ground plane in the touchpad printed circuit board provides a transmission path through the bottom surface of the information handling system. An antenna positioned in the touchpad area thus provides good radiation coverage in various portable configurations, such as the clamshell and tablet positions, without compromising housing integrity.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A portable information handling system integrates one or more antenna in a touchpad to support wireless communication. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
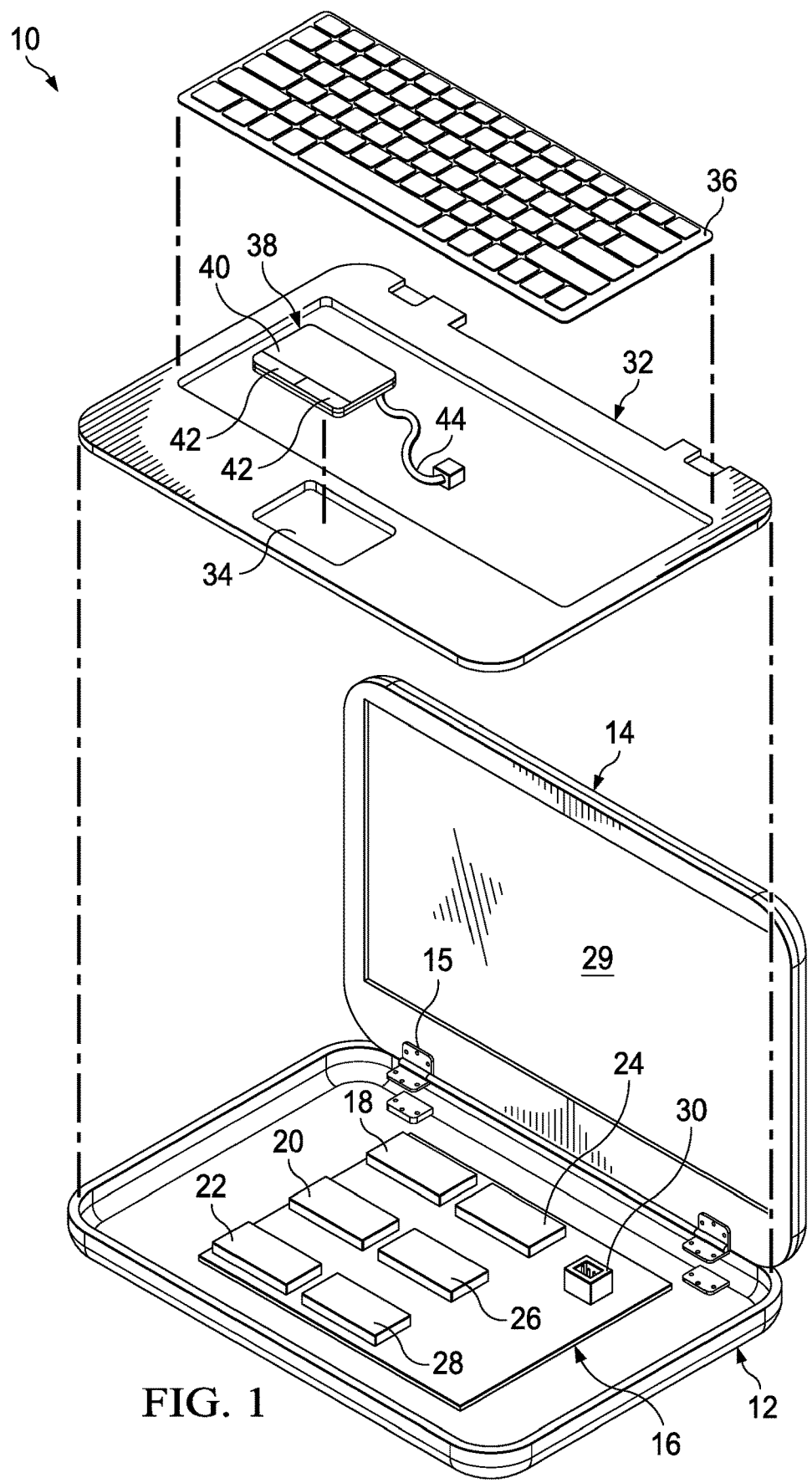
FIG. 1 depicts an upper perspective exploded view of an information handling system having a touchpad configured to integrate a wireless antenna.

Referring now to FIG. 1, an upper perspective exploded view depicts an information handling system 10 having a touchpad 38 configured to integrate a wireless antenna. In the example embodiment, information handling system 10 has a main housing portion 12 rotationally coupled to a lid housing portion 14 by a hinge 15 to support rotational movement between closed and open positions. Main housing portion 12 contains a motherboard 16 that interfaces processing components configured to cooperate to process information. For example, a central processing unit (CPU) 18 interfaces with random access memory (RAM) 20 through motherboard 16 to execute instructions that processes information. A solid state drive (SSD) 22 or other persistent storage device stores the instructions and information during power down of CPU 18. An embedded controller 24 manages power to the processing components and interfaces CPU 18 with input/output (I/O) devices. For instance, at power up embedded controller 24 executes pre-boot code stored in flash memory to retrieve a BIOS and operating system from storage in SSD 22 to RAM 20 for execution by CPU 18. A chipset 26 interacts with CPU 18 to control clock operations, memory accesses, graphics, communication links and similar functions. A wireless network interface card (WNIC) 28 includes a transceiver and other wireless networking devices to support wireless communications between the information handling system and external radios, such as for communication through a wireless local area network (WLAN), wireless wide area network (WWAN) and wireless personal area network (WPAN). A display 29 integrated in lid housing portion 14 interfaces through a cable with CPU 18 or a graphics processor to present information as visual images. For instance, pixel values generated by CPU 18 or a separate graphics processor are communicated to display 29 to define a visual image at pixels of display 29. In various embodiments, other types of processing components may be included or altered to achieve a desired information handling system performance.

In the example embodiment, a cover 32 is placed over main housing portion 12 to cover the processing components. Metallic construction of main housing portion 12, lid housing portion 14 and cover 32 provides structural integrity that aids management of torsional forces during rotational movement, although other materials may be used. Cover 32 includes an opening 34 sized to accept touchpad 38, although touchpad 38 may alternatively fit on top of cover 32. A keyboard 36 couples over cover 32, although keyboard 36 may alternatively fit through an opening formed in cover 32 to fit the dimensions of keyboard 36. In the example embodiment, touchpad 38 accepts touch inputs at a touch detection surface 40 and accepts button inputs at input buttons 42. Inputs made at touchpad 38 are communicated through a cable 44 to a cable port 30 coupled to motherboard 16. An end user interacting with information handling system 10 makes keyed inputs to keyboard 36, such as with QWERTY keys, and touch inputs at touchpad 38, with display 29 presenting the inputs based upon processing performed by CPU 18. In the depicted clamshell position, lid housing portion 14 holds display 29 vertically relative to main housing portion 12 so that an end user may make typed inputs to keyboard 36 and touch inputs to touchpad 38 while viewing display 29. Touchpad 38 operates in a conventional manner to provide mouse functionality integrated in the upper surface of information handling system 10. For example, touches detected at touch surface 40 translate to movement of a cursor on display 29 similar to movements of a mouse. Presses at input buttons 42 translate to mouse clicks, with the right button as a right mouse click and the left button as a left mouse click. In alternative embodiments, alternative touchpad 38 configurations may be used. For instance, touchpad 38 may move at the front of cover 32 in response to a touch depression instead having a set of separate buttons.

Metallic materials for main housing portion 12, lid housing portion 14 and cover 32 impedes wireless signal transfer from transceivers of WNIC 28 located inside the metal enclosure to external radios outside the metal enclosure. To aid in wireless signal communication, antenna integrated in touchpad 38 and external to the metallic enclosure interface through cable 44 with WNIC 28 to exchange wireless signals with external radios. For instance, cable 44 includes a coaxial cable component that transfers wireless signals through a shielded conductor. Integrating the antenna in touchpad 38 frees space along the perimeter of display 29, where antenna are often disposed, so that a narrow bezel solution for presenting visual images is supported.

Figure 2:
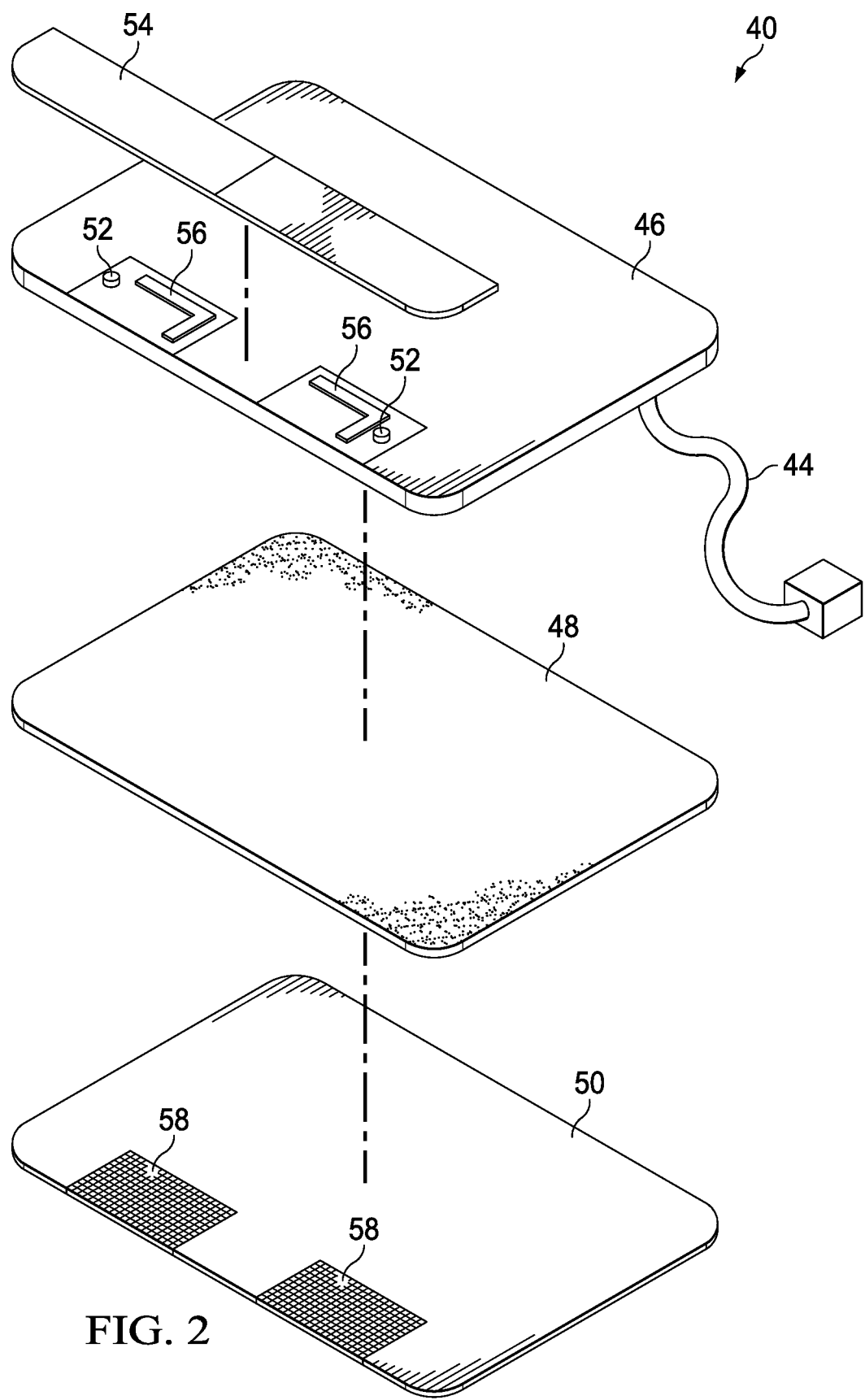
FIG. 2 depicts an exploded view of a touchpad having antenna integrated in its printed circuit board.

Referring now to FIG. 2, an exploded view depicts a touchpad 38 having antenna 56 integrated in its printed circuit board. The printed circuit board is depicted with three layers in the exploded view. A PCB touch detection layer 46 is presented at the top layer and includes touch detection structures, such as a capacitive sensor layer. For instance, touches at touch detection layer 46 change capacitance at an integrated grid of touch detection conductive elements, such as with near field effect. The location of touches are determined based upon capacitance detected at intersections of the conductive elements, such as by touch controller interfaced with the conductive elements, although various other embodiments of touch detection may be used. In addition to the touch detection conductors, PCB touch detection layer 46 includes first and second push buttons 52 that depress to accept "click" inputs. In some instances, push buttons 52 are pressed from above or from below by moving buttons coupled near touchpad 38. Alternatively, touchpad 38 may move so that buttons 52 contact a fixed input device. For instance, touchpad 38 may be mounted to support a lever motion about an axis at its rear that provides sufficient motion at the front to press buttons 52 against a fixed location.

Antenna 56 in the example embodiment are wirelines formed in PCB touch detection layer 46 that radiate with resonance of a desired wireless communication frequency, such as 2.4 GHz and 5 GHz used by various 802.11 WLAN standards. In alternative embodiments, an antenna integrated circuit may be used as may other antenna structures. Antenna 56 may also interface directly with a transceiver integrated circuit mounted directly to PCB touch detection layer 46, such as next to or as a part of a touch controller. Cable 44 interfaces with the touch controller and antenna 56 to communicate touch positions, button presses and wireless signals to motherboard 16. In one embodiment, cable 44 integrates both a data link, such as an I2C link, and a coaxial cable in a single cable structure. Alternatively, antenna 56 may couple to a separate coaxial cable that transfers only the wireless signals.

PCB touch detection layer is formed over a PCB insulating layer 48, which in turn is formed over a PCB ground layer 50. A solid ground layer, such as a plane of copper, enhances the sensitivity of PCB touch detection layer 46. A solid ground layer 50 will, however, impede transfer of wireless signals to and from antenna 56. In order to improve wireless signal reception and transmission in an isotropic manner, a mesh or grid of openings 58 are formed in ground layer 50 underneath antenna 56. In the example embodiment, square openings form to have 0.4 mm, 0.6 mm or 0.8 mm gap size to allow penetration of 2.4 GHz and 5 Ghz signals. In alternative embodiments, alternative sized openings may be used based upon anticipated wireless signal wavelengths. Further, instead of regularly spaced square grids, the openings may have alternative shapes, such as circular shapes, or an irregular size that changes based upon relative position to antenna 56.

Figure 3:
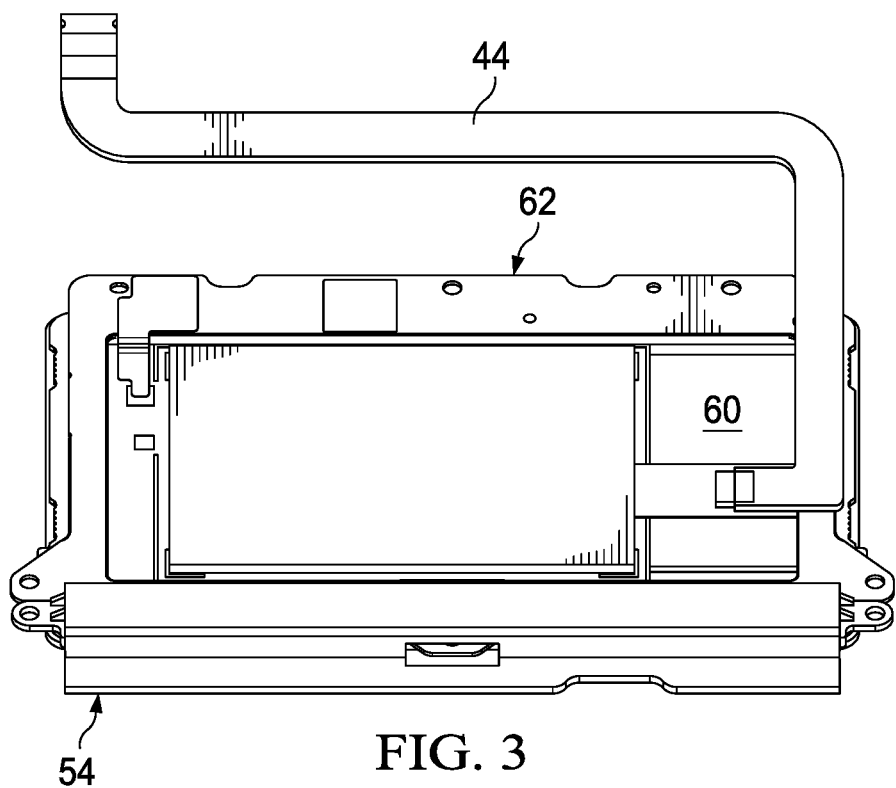
FIG. 3 depicts a top view of the touchpad and bracket with a cover disposed over the antenna integrated in the touchpad printed circuit board.

Referring now to FIG. 3, a top view depicts touchpad 38 and a bracket 62 with a cover 54 disposed over the antenna integrated in the touchpad printed circuit board. Cable 44 interfaces with a touch controller 60 that detects touches at touch detection layer 46. Upon installation in information handling system 10, cover 54 is exposed at the exterior upper surface of cover 32 to accept end user presses. In the example embodiment cover 54 is a solid non-metallic material, such as plastic, that extends along the front length of touch pad 38 so that a touch on the left side is a left mouse click and a touch on the right side is a right mouse click. Bracket 62 attaches to the perimeter of touch detection surface 46 and includes attachment points that couple to cover 32. Bracket 62 defines an interior space in which touch detection layer 46 is exposed at cover 32 to accept end user touches.

Figure 4A:
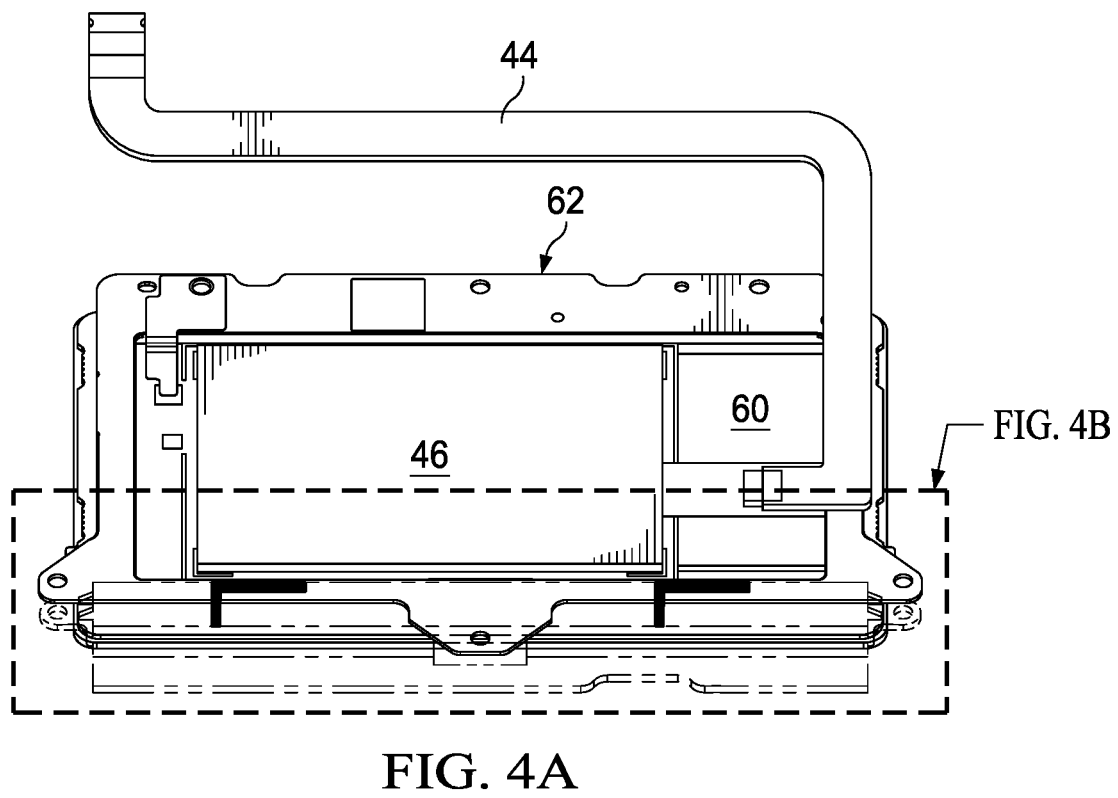
FIGS. 4A and 4B depict a top view of the touchpad having the cover removed to expose the antenna integrated in the printed circuit board of the touchpad.
Figure 4B:
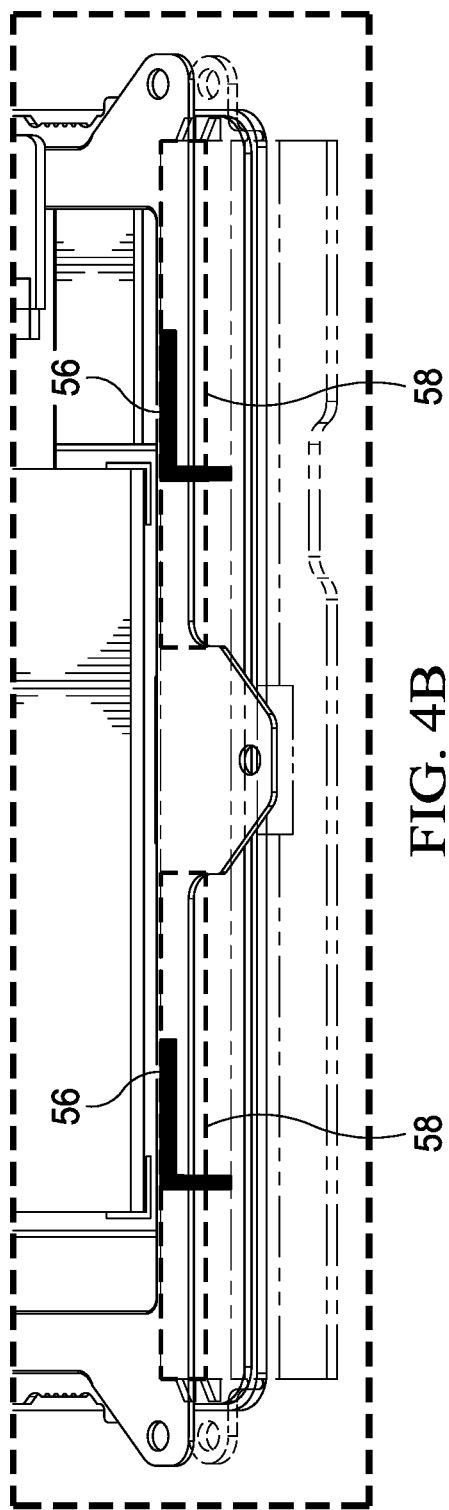

Referring now to FIGS. 4A and 4B, a top view depicts touchpad 38 having cover 54 removed to expose antenna 56 integrated in the printed circuit board of the touchpad 38. Bracket 62 couples to the printed circuit board so that the front edge of PCB touch detection layer 46 extends past bracket 62 and exposes antenna 56. In the enlarged view of FIG. 4B, antenna 56 are depicted as exposed along the outside edge of touch detection layer 46 and above an outline that represents mesh openings 58 formed below antenna 56. In the exposed location, wireless signals transfer at antenna 56 through cover 54 without interference related to cover 32.

Figure 5:
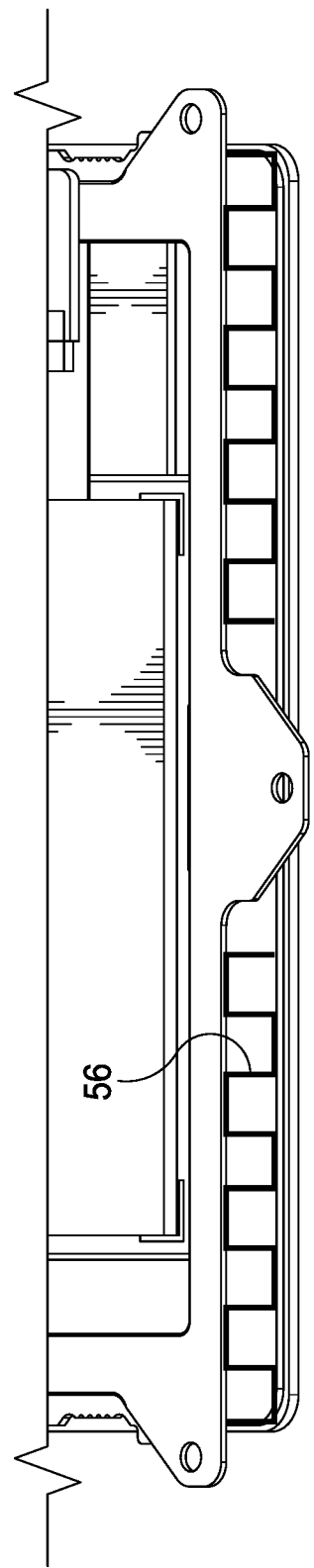
FIG. 5 depicts an alternative antenna configuration integrated in the touchpad printed circuit board.

Referring now to FIG. 5, an alternative antenna configuration is depicted integrated in the touchpad printed circuit board. In the example embodiment, antenna 56 has a square wave footprint formed in PCB touch detection layer 46. In alternative embodiments, alternative forms may be used. The example embodiment describes antenna formed in a touchpad 38. In alternative embodiments, a similar antenna formation may be defined in a keyboard area, such as in a touch detection membrane under the keyboard's space key.

Although the present invention has been described in detail, it should be understood that various changes, substitutions and alterations can be made hereto without departing from the spirit and scope of the invention as defined by the appended claims.

What is claimed is:

1. An information handling system comprising:
   a main housing portion;
   a lid housing portion;
   a hinge rotationally coupling the main and lid housing portions;
   a central processing unit disposed in the main housing portion and operable to process information;
   a memory disposed in the main housing portion and interfaces with the central processing unit, the memory operable to store information;
   a display disposed in the lid housing portion and interfaced with the central processing unit, the display operable to present the information as visual images;
   a wireless network device disposed in the main housing portion and interfaced with the central processing unit, the wireless network device having a transceiver operable to communicate the information as wireless signals;
   a keyboard disposed at an upper surface of the main housing portion and interfaces with the central processing unit to accept keyed inputs from an end user;
   a touchpad disposed in the upper surface of the main housing portion and interfaced with the processor, the touchpad having a touch surface operable to accept touch inputs and a printed circuit board disposed below the touch surface, the printed circuit board supporting touch input communication to the central processing unit; and
   one or more antenna intergrated in the touchpad printed circuit board and interfaced with the wireless network device to transmit and receive the wireless signals.

2. The information handling system of claim 1 further comprising:
   a ground plane formed in the printed circuit board; and
   a mesh pattern formed in the ground plane proximate the one or more antenna.

3. The information handling system of claim 2 wherein the mesh has plural openings sized to pass wireless signals having a predetermined radio wavelength.

4. The information handling system of claim 3 wherein the one or more antenna comprise a wireless local area network antenna and the mesh plural openings are sized to pass wireless signals having a wavelength of at least 2.4 GHz.

5. The information handling system of claim 1 wherein the touchpad further comprises:
   one or more buttons disposed at one side and interfaced with the printed circuit board, the one or more buttons operable to depress to accept an end user input; and
   a non-metallic cover disposed over each of the one or more buttons;
   wherein the one or more antenna integrated in the printed circuit board proximate the one or more buttons.

6. The information handling system of claim 1 wherein the touchpad mounts to the upper surface to flex along one side, the flex allowing the printed circuit board to depress along the one side to accept an end user input, the one or more antenna integrated along the one side.

7. The information handling system of claim 6 further comprising a non-metallic cover disposed over the one side.

8. The information handling system of claim 7 wherein the printed circuit board further comprises:
   a ground plane; and
   a grid pattern formed in the ground plane along the one side.

9. The information handling system of claim 1 further comprising:
   a bracket coupling the touchpad to the main housing portion upper surface, the bracket having a rectangular shape with an open central region to provide access to the touchpad;
   wherein the touchpad extends outside of the bracket along one side, the one or more antenna integrated in the touchpad at the one side outside the bracket.

10. A method for communicating wireless signals at a portable information handling system, the method comprising:
    integrating a wireless network device in a housing of the portable information handling system;
    integrating an antenna into a touchpad printed circuit board;
    integrating the touchpad into an upper side of the housing;
    interfacing the wireless network device and the antenna; and
    communicating the wireless signals through a cable connecting the wireless network device and the antenna.

11. The method of claim 10 further comprising:
    integrating the antenna at one side of the touchpad proximate an input button of the touchpad that depresses to accept an end user input; and
    covering the input button with non-metallic material.

12. The method of claim 11 further comprising:
    integrating a ground plane in the touchpad printed circuit board; and
    forming a grid pattern in the ground plane below the antenna, the grid pattern having openings of sufficient size to pass the wireless signals.

13. The method of claim 10 further comprising:
    mounting the touchpad to depress along one side to accept an end user input; and
    integrating the antenna at the one side.

14. The method of claim 13 wherein:
    the mounting further comprises coupling the touchpad to the upper side of the housing with a bracket having a rectangular opening, a touch surface of the touchpad exposed through the opening, at least a portion of the touchpad printed circuit board extending outside the opening at the one side; and
    the integrating the antenna at the one side further comprising integrating the antenna in the printed circuit board extending outside the opening.

15. The method of claim 14 further comprising:
    integrating a ground plane in the touchpad printed circuit board; and
    forming a mesh pattern in the ground plane extending outside the opening.

16. The method of claim 15 further comprising covering the touchpad printed circuit board extending outside the opening with a non-metallic input button.

17. A touchpad comprising:
    a printed circuit board having a touch detection surface disposed over a ground plane, the touch detection surface operable to detect end user touches;
    one or more input buttons disposed along one side of the touch detection surface;
    one or more antenna integrated in the printed circuit board proximate the one or more buttons; and
    a cable interfaced with the one or more antenna, the cable operable to communicate wireless signals between the printed circuit board and a transceiver;

wherein the ground plane disposed below the one or more antenna forms plural openings sized to pass wireless signals of a wavelength.

18. The touchpad of claim 17 further comprising:
a bracket coupled around a perimeter of the touch detection surface, the bracket having a central opening providing access to the touch detection surface;
wherein the printed circuit board extends outside of the bracket at the one or more buttons, the antenna disposed on the printed circuit board outside of the bracket.

19. The touchpad of claim 18 further comprising a plastic cover disposed over the one or more input buttons.

* * * * *